United States Patent [19]
Barrett et al.

[11] Patent Number: 5,683,507
[45] Date of Patent: Nov. 4, 1997

[54] APPARATUS FOR GROWING LARGE SILICON CARBIDE SINGLE CRYSTALS

[75] Inventors: Donovan L. Barrett, Penn Hills Township; Raymond G. Seidensticker, deceased, late of Forest Hills, by Joan Seidensticker, heir; Richard H. Hopkins, Murrysville, all of Pa.

[73] Assignee: Northrop Grumman Corporation, Los Angeles, Calif.

[21] Appl. No.: 523,303

[22] Filed: Sep. 5, 1995

[51] Int. Cl.$^6$ .................................................. C30B 35/00
[52] U.S. Cl. ..................... 117/200; 117/202; 117/204; 117/900
[58] Field of Search ....................... 117/200, 202, 117/204, 900

[56] References Cited

U.S. PATENT DOCUMENTS

| | | |
|---|---|---|
| 2,854,364 | 9/1958 | Lely . |
| 3,520,740 | 7/1970 | Addamiano . |
| 4,175,291 | 11/1979 | Spence . |
| 4,183,040 | 1/1980 | Rideout . |
| 4,864,380 | 9/1989 | Plus et al. . |
| 4,866,005 | 9/1989 | Davis et al. . |
| 5,211,801 | 5/1993 | Stein . |

FOREIGN PATENT DOCUMENTS

| | | | |
|---|---|---|---|
| 4023096A1 | 10/1994 | Germany | 117/200 |

OTHER PUBLICATIONS

"General Principles of Growing Large–Size Single Crystals of Various Silicon Carbide Polytypes", Yu.M. Tairov, V.F. Tsvetkov Journal of Crystal Growth, pp. 146–150 (1981).

"Investigation of Growth Processes of Ingots of Silicon Carbide Single Crystals", Yu.M. Tairov, V.F. Tsvetkov, Journal of Crystal Growth, pp. 209–212 (1978).

"Bulk and Perimeter Generation in 6H–SiC Diodes", J.A. Cooper, Jr. J.W. Palmout, C.T. Gardner, M.R. Melloch, C.H. Carter, Jr. International Semiconductor Device Research Symposium, Charlottesville, VA, Dec. 1991.

"Darstellung von Einkristallen von Siliciumcarbid und Beherrschung von Art und Menge der eingebauten Verunremigungen" by J.A. Lely, Ber. Deut; Keram. Ges., 32 (1955), pp. 229–231.

"Growth Phenomena in Silicon Carbide" by W.F. Knippenberg, Philips Research Reports, vol., 18, No. 3, Jun. 1963.

"General Principles of Growing Large–Size Single Crystals of Various Silicon Carbide Polytypes"—Yu, et al.; J. of Cryst. Growth 52 (1981) pp. 146–150.

*Primary Examiner*—Felisa Garrett
*Attorney, Agent, or Firm*—Walter G. Sutcliff

[57] ABSTRACT

An apparatus for growing single-polytype, single crystals of silicon carbide utilizing physical vapor transport as the crystal growth technique. The apparatus has a furnace which has a carbon crucible with walls that border and define a crucible cavity. A silicon carbide source material provided at a first location of the crucible cavity, and a monocrystalline silicon carbide seed is provided at a second location of the crucible cavity. A heat path is also provided in the furnace above the crucible cavity. The crucible has a stepped surface that extends into the crucible cavity. The stepped surface has a mounting portion upon which the seed crystal is mounted. The mounting portion of the stepped surface is bordered at one side by the crucible cavity and is bordered at an opposite side by the furnace heat path. The stepped surface also has a sidewall that is bordered at one side by and surrounds the furnace heat path. The apparatus may also have a thermal insulating member, in which a side of the stepped surface sidewall opposite to the furnace heat path is bordered by the thermal insulating member.

13 Claims, 5 Drawing Sheets

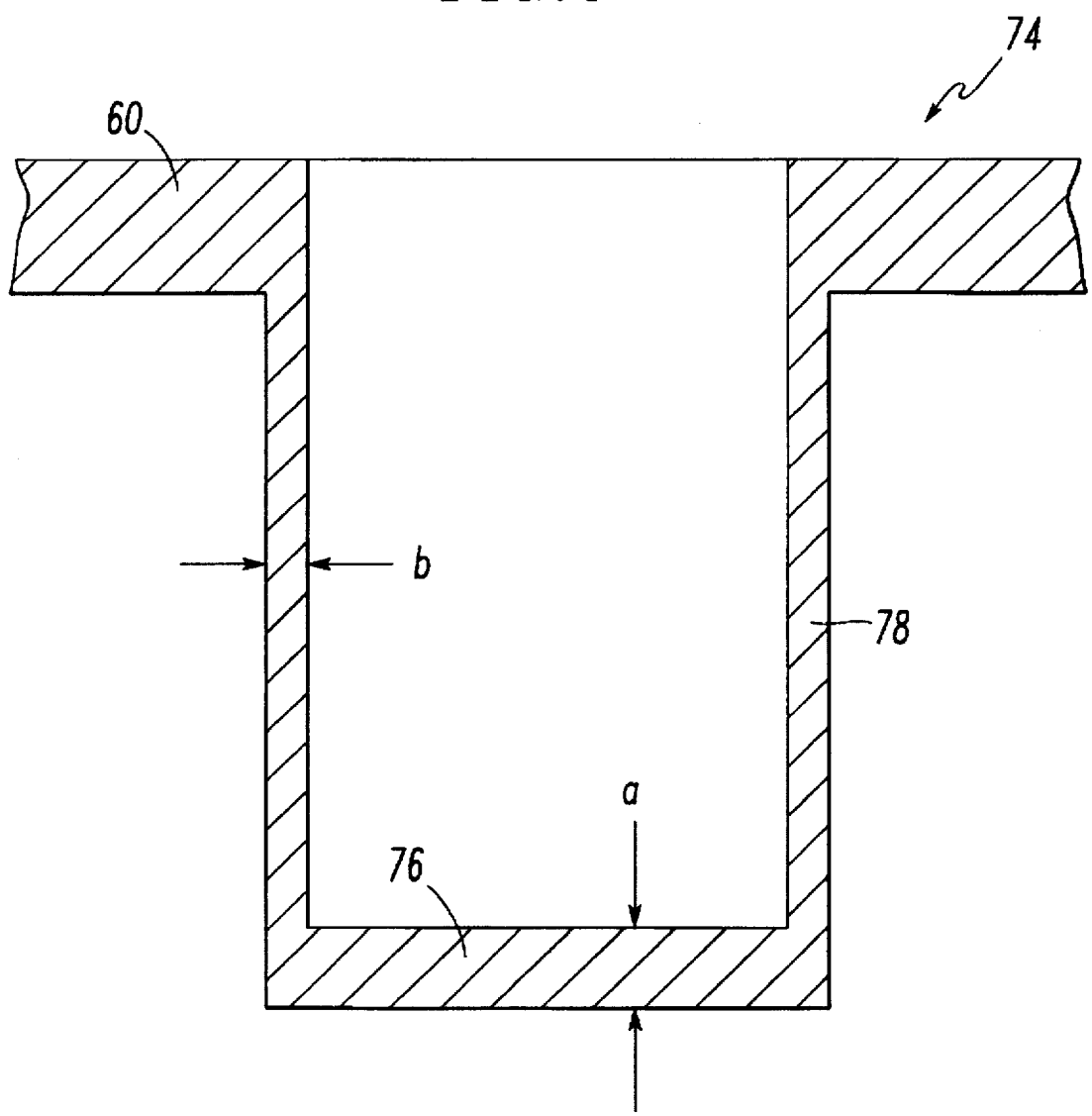

APPARATUS FOR GROWING LARGE SILICON CARBIDE SINGLE CRYSTALS

BACKGROUND OF THE INVENTION

1. Field of the Invention

The present invention relates to structures and methods for producing large, single-crystals of silicon carbide with crystalline quality suitable for use in semiconductor devices.

2. Description of the Prior Art

Silicon carbide is a wide bandgap semiconductor material with physical and chemical properties unmatched for high power microwave, temperature tolerant, and radiation resistant applications. For example, silicon carbide exhibits a critical electric-field breakdown strength of approximately ten times that of silicon, the most commonly used semiconductor material. Also, silicon carbide has a high-field electron velocity equal to gallium arsenide, a semiconductor material commonly utilized for its high electron velocity property. Further, silicon carbide exhibits a higher thermal conductivity (an advantageous property in the operation of certain semiconductor-based devices) than silicon and gallium arsenide, having a value near that of copper. Silicon carbide based microwave transistors and integrated circuits could provide approximately five times the power density of gallium arsenide based MMICs at X-band frequencies, and approximately ten times the power density of silicon at UHF-band to S-band frequencies.

A basic requirement for the use of silicon carbide as a semiconductor material is that the silicon carbide be prepared as large single crystals. The large single crystals should be prepared with a size sufficient for economic applications and have a structure consisting of a repeated atomic arrangement with a minimum of defects in the periodic array.

Single crystals of silicon carbide have been obtained as platelets found within cavities in the large Acheson furnaces used to produce silicon carbide grain. These platelets were found in general to be defective, with no control of the platelet growth process.

The first single crystals were grown in the laboratory by a sublimation vapor-condensation growth technique by J. A. Lely that was reported in Ber. Deut. Keram. Ges., 32, (1955) pp. 229–251 and described in U.S. Pat. No. 2,845,364. In this technique, Lely constructed an artificial cavity with pieces of silicon carbide from the Acheson process, placed the cavity within a graphite crucible and heated this charge to above 2500° C. in an inert argon atmosphere where vapors from the subliming charge condensed at random sites within the cooler cavity wall to form platelets of silicon carbide.

Between 1958 and 1978, a number of investigators expended a large amount of activity in an attempt to control the sublimation-vapor transport process and improve the size and quality of the grown platelets. However, the essential drawbacks to the Lely process—uncontrolled nucleation of multiple intergrown platelets, the small size of platelets, and non-uniform growth rate of individual platelets—were not overcome. In addition, the silicon carbide platelets generally contained layers of different polytype layers with crystallographic structure having different stacking orders of the silicon and carbon atoms comprising the crystal. While the different polytypes exhibit nearly identical physical properties, a significant difference may be observed in the electrical and optical properties of each polytype. Single-crystal, single-polytype silicon carbide material is required for efficient device fabrication, since the occurrence of random polytypes within the crystal will adversely affect the electronic properties of devices fabricated on them.

The growth of cylindrical single-crystal boules was first described in a publication by Yu. M. Tairov and V. F. Tsvetkov, in J. Crystal Growth 43, (1978) pp. 209–212, in which small ingots 8-mm in diameter and 8-mm in length were grown. This development incorporates a seed crystal in order to control nucleation, and in this manner is similar to the growth techniques used to grow single crystals of silicon. In this technique, as described in Yu. M. Tairov and V. F. Tsvetkov, J. Crystal Growth 52 (1981) pp. 146–150, a graphite crucible is used wherein a single crystal seed placed in one portion of the crucible is separated from silicon carbide grain placed in another portion of the crucible. The seed temperature is raised to a temperature of 1800°–2000° C. and the source temperature raised to a higher temperature than the seed, and sufficient to provide a temperature gradient of about 30° C./cm between source and seed. Nucleation of growth on the seed surface was effected under approximately a 100 Torr pressure of argon to stabilize the polytypic structure of the deposition. The growth rate was then slowly increased by evacuating the system to a pressure of $10^{-1}$–$10^{-4}$ Torr according to an exponential law with a time constant of approximately 7 minutes. Mass transfer is effected by the fluxes of the gas phase components Si, $Si_2C$ and $SiC_2$ formed as a result of decomposition of the SiC source material.

Tairov and Tsvetkov further noted that the vapor pressure of Si exceeds the vapor pressure of $Si_2C$ and $SiC_2$, and reacts with the lower temperature graphite walls of the growth cell. Growth at source-to-seed separations of greater than 10 mm was obtained as silicon vapor acts as a carbon transporting agent with the graphite cell being the carbon source. Tairov and Tsvetkov suggested that it is possible to control the polytypic structure of the growth by selecting seeds of the required polytype, or by growing the crystal on faces forming an angle to the (0001) surface. To grow polytypic homogeneous crystals, it is also necessary to eliminate supersaturation fluctuations during crystal growth.

The production of 6H-polytype single crystal boules up to 20-mm in diameter and 24-mm in length suitable for use as blue light emitting diode substrate material was reported by Ziegler et al., in IEEE Trans. Electron Der., ED-30, 4 (1983) pp. 277–281, and described in German patent DE 3,230,727. Ziegler et al. referred to this process as the "modified Lely technique". The process described by Ziegler et al. is based on the knowledge that the Tairov method produced crystals with mixed polytypes due to the following: the temperature gradient was too high, the pressure of the protective gas was too low, and the temperature of the seed should be selected in accord with the vapor pressure diagram given by Knippenberg in Growth Phenomena in Silicon Carbide, Philips Research Reports 18, (1963) pp. 164–166.

The process described by Ziegler et al. limits the temperature gradient in the direction of epitaxial growth to no more than 25° C./cm, holds the temperature of the seed crystal to a range of 2100°–2300° C., and adjusts the pressure of the protective gas to be at least as high as the total of the gas partial pressures of the deposition components. Ziegler et al. described a proportedly advantageous arrangement of the sublimation growth crucible by placing porous graphite outside the reaction zone and placing the sublimation source behind the porous partition above the deposition zone. The temperature gradient is provided by additional heating of the source end of the crucible, or by additional cooling of the seed. The cooling of the seed is typically achieved by conductive cooling means such as a "cooling finger" or "cold finger" extending out of the crucible into the vacuum chamber. The use of a cold finger is familiar to those with ordinary expertise in the area of condensation of vapors. And, while the use of a "cold finger" is normally restricted to the condensation of vapor to form a liquid, the cooling of a vapor to form a solid will be familiar to those practiced in the art of crystal growth.

U.S. Pat. No. 4,886,005 to Davis et al. provides a method of reproducibly controlling the growth of large single crystals of silicon carbide using a technique called physical vapor transport "PVT"), a technique also referred to as the "modified Lely technique". Physical vapor transport is the current preferred general method in the industry for the growth of silicon carbide crystals, and consists of a furnace having a graphite (carbon) crucible with a cavity therein. The furnace further has a means for heating the crucible and cavity. A source material of silicon carbide is provided at a first region within the crucible cavity, while a silicon carbide monocrystalline seed is positioned at a second region within the crucible cavity. In silicon carbide crystal growth, where the sublimation space must be kept above 1900° C. and due to the high reactivity of the silicon-containing vapor, carbon or graphite are currently the only crucible materials capable of practical use. The presence of a free carbon is an important part of the chemical reaction to produce silicon carbide crystalline material, where the principal vapor components are Si, $Si_2C$ and $SiC_2$ (Drowart et al., J. Chem. Phys., 29 pp. 1015–1021, 1958).

According to Davis et al., controlled, repeatable growth of silicon carbide of desired polytype is achieved by generating and maintaining a substantially constant flow of vaporized Si, $Si_2C$, and $SiC_2$ per unit area per unit time from the source to the growth surface of the seed crystal. To maintain this constant flow of vaporized Si, $Si_2C$ and $SiC_2$, a source powder is used having a selected graph size distribution and that has substantially the same desired polytype as the seed crystal. Further, the source is fed by various means to maintain essentially constant source characteristics. Davis et al. also describe the use of a monocrystalline seed of desired polytype with off-axis growth face as previously described by Tairov, and manipulation of the source temperature to maintain a constant temperature gradient between the subliming source powder and the growth surface as would be obvious to those with ordinary experience in crystal growth.

The use of thermal gradients in the modified Lely technique for growth of silicon carbide has been described by Tairov et al. in J. Crystal Growth 52, 1981, p. 147 and by Davis et al. in U.S. Pat. No. 4,866,005. However, if portions of the crucible surrounding the seed crystal are sufficiently cooled while achieving the thermal gradient, nucleation will result. For example, if axial movement of a heating element (such as an induction coil) is used to provide a temperature difference between the source and seed end of the crucible, portions of the crucible may simultaneously be cooled sufficiently to allow nucleation on portions of the graphite crucible surrounding the seed crystal. Such nucleation and incursion of extraneous polycrystalline material into the grown crystal has been demonstrated by Ziegler et al. , (IEEE Trans. Electron Dev. ED-30, 4, 1983, p. 279).

Furthermore, if during seed growth, the source is removed from the crystal growth front a distance of more than approximately 10 mm, the higher partial vapor pressure of silicon reacts with carbon in the vicinity of the growth front to provide the deposition species. However, portions of the carbon crucible in proximity to the seed and growth front will become overcooled and will become a surface for nucleation and for the growth of unwanted polycrystalline material.

Thus, a method is needed that allows for the growth of a single crystal of silicon carbide, while preventing the nucleation of extraneous crystallites.

SUMMARY OF THE INVENTION

An improved method for the physical vapor transport growth of silicon carbide is provided that efficiently removes heat from the crystal during growth, while keeping the surroundings at a higher temperature sufficient to prevent deposition upon these surrounding surfaces. In this way, deposition from the vapor onto the growing crystal surface is facilitated. The benefits of the presently described methods are the production of larger diameter crystals then heretofore achieved, consistent control in the preparation of single-crystal polytypes, and reduced microcrystalline defects within the grown crystals.

The method of the present preferred systems differs significantly from the methods of the prior art described above in that a system to manage the heat flow within the growth cavity and to efficiently remove heat from the crystal during growth is described herein. The cooling of the seed occurs by a combination of efficient radiation and heat flow design which differs from that proposed in the prior art. The use of this teaching also obviates the necessity for the use of source powder of selected polytype and size distribution and obviates the need to keep the source to seed distance to less than 10 mm, as was taught in the prior art.

Single crystals 50 mm in diameter and 75 mm in length of 6H and 4H single-polytype have been consistently grown through the teachings of the present preferred embodiments, using either a commercial green grain source material, or grain produced by the reaction of pure silicon and carbon components. Further, single polytype crystals up to 75 mm diameter have been produced. This size boule is substantially larger than reported to date, and there appears to be no reason to believe that the growth of larger crystals may not be achieved using the presently preferred method.

The presently preferred methods for growing the silicon carbide crystal utilizes PVT (also called the modified Lely technique). Thus, the present methods utilizes a furnace having a carbon, preferably graphite, crucible with a cavity provided therein. A means for heating the crucible and cavity is also used. A silicon carbide source material is provided at a first location within the cavity while a silicon carbide monocrystalline seed is positioned at a second region within the crucible cavity. A heat path is also provided in the furnace above the crucible cavity.

The crucible has a stepped surface that extends into the crucible cavity. The stepped surface has a mounting portion upon which the seed crystal is mounted. The mounting portion of the stepped surface is bordered at one side by the crucible cavity and is bordered at an opposite side by the furnace heat path. The stepped surface also has a sidewall that is bordered at one side by and surrounds the furnace heat path. The apparatus may also have a thermal insulating member, in which a side of the stepped surface sidewall opposite to the furnace heat path is bordered by the thermal insulating member. Preferably, the stepped surface is a portion of a wall of the crucible. However, the stepped surface may be a separate member that is attached to one or more walls of the crucible.

The preferred crystal-growth method is performed in generally two stages. In the first stage of the crystal-growth method, the crucible is uniformly heated in an inert gas atmosphere, preferably pure argon, to a temperature where a small partial vapor pressure of the subliming species from the silicon carbide source material exists.

In the second stage of the crystal-growth method, a temperature gradient is provided between the first and second regions of the cavity, such that the seed in the second region of the cavity is kept at a temperature lower than the temperature of the first region. The gaseous atmosphere within the growth cavity is reduced by pumping until the partial pressure of the subliming species from the SiC source in the first region is increased significantly to become transported to the cooler second region, where the vapor is condensed upon the single crystal seed to epitaxially grow a crystal of silicon carbide having the same crystallographic properties as the initial "seed" crystal.

The temperature gradient between the seed and the source may be provided by several different means. In general, the temperature gradient may be provided by elevating the temperature of the source material, or conversely by lowering the temperature of the seed, or both.

In the preferred embodiment, the crucible is inductively heated using an induction coil system while the temperature at the source end of the crucible is elevated by axial displacement of the induction coil towards the source end. Assuming the length of the induction coil is short compared with the crucible, axial movement of the coil towards the source end will result in heating the source while also reducing the temperature of the seed located at the opposite end of the crucible.

Alternative methods may be employed to achieve the desired thermal gradient. For example, a resistance heater of proper design may be used. Also, dual resistance heaters or dual coils may be utilized. Further, resistive and inductive heaters may be used in combination.

As implied above, it is well known to those versed in the techniques of crystal growth that the growth of a single crystal by condensation from the vapor phase requires that the deposition surface be cooled in comparison to all the surrounding surfaces to avoid the formation of extraneous crystals, or that the surrounding surfaces be such as to reject deposition. Thus, one of the features of the present invention is the management of heat flow in the carbon or carbon-like crucible to keep the surfaces proximate to the seed sufficiently hot relative to the cooler seed surface and thus prevent spurious nucleation and growth of polycrystals, or to avoid spurious nucleations which may contribute to defects within the single crystal growth.

High temperature furnaces used for the sublimation growth of silicon carbide are typically constructed with insulating material surrounding the graphite crucible, to manage the high temperatures which must be achieved and maintained over relatively long periods of time. In the preferred induction heating system, this insulation is placed in close proximity around, above and below the crucible. In resistance heated furnaces the insulation must be placed outside the resistance heater, and as a consequence subjects the heater to abnormal erosion effects at the high temperatures necessary to sublime silicon carbide efficiently.

A controlled heat leak is described herein that extends through the insulation surrounding the crucible. The function of this insulation is to cool the crystal from the seeded end of the growing crystal, and provide the temperature gradient required for an efficient crystal growth manufacturing method. The teaching incorporates a combination of graphite conducting elements and insulating elements of controlled and adjustable thickness placed within the growth cavity and surrounding the crystal.

The objects and advantages of this teaching will become apparent from a description of certain present preferred embodiments thereof shown in the drawings.

BRIEF DESCRIPTION OF THE DRAWINGS

FIG. 5 is a front elevational view of a preferred stepped surface utilized in the second preferred growth system of FIG. 4.

DETAILED DESCRIPTION OF THE PREFERRED EMBODIMENTS

Figure 1:
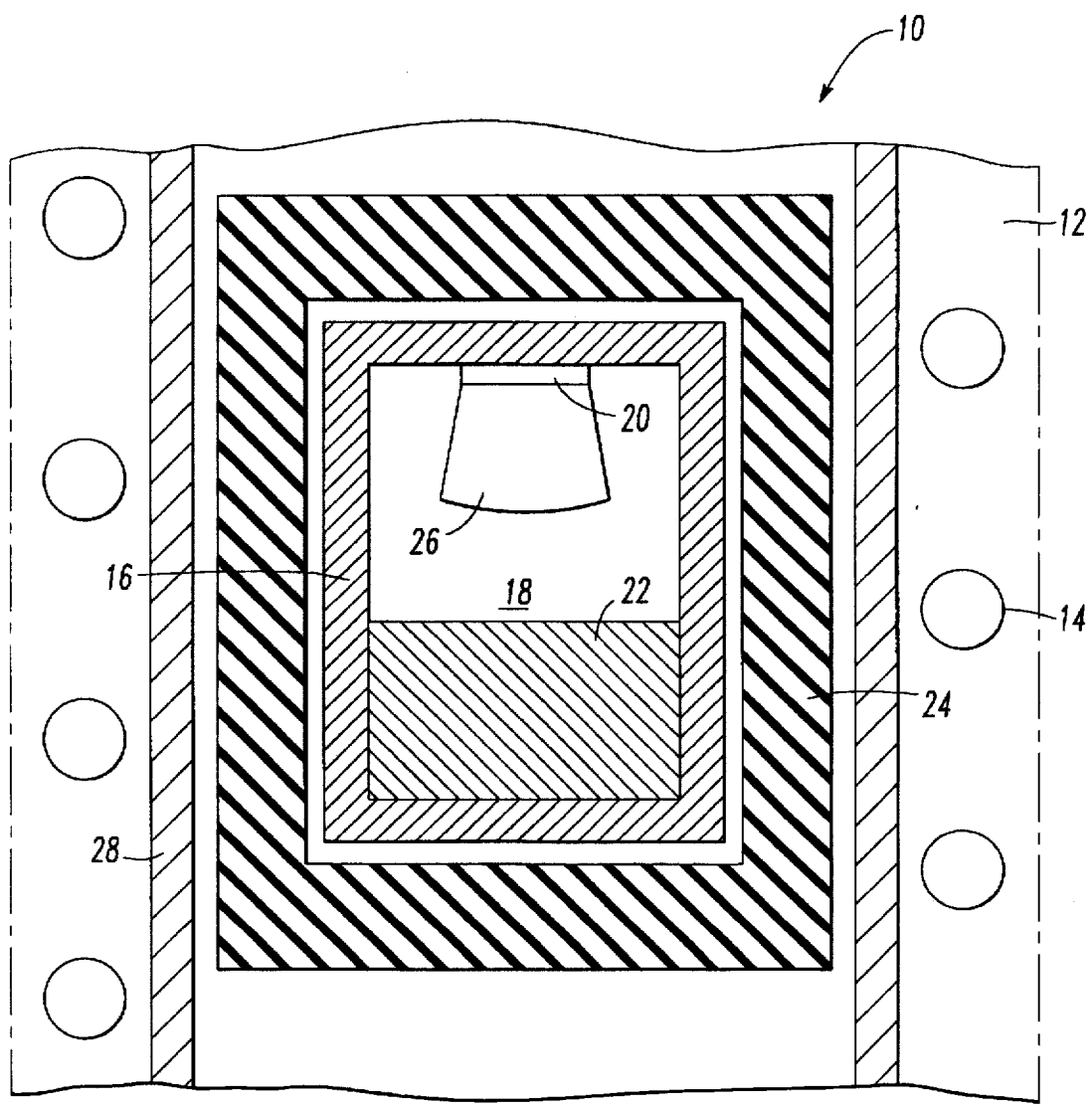
FIG. 1 is a schematic representation of a prior art system for growing silicon carbide crystals.

To better understand the operation of the preferred invention, a brief description of the general prior art method of producing silicon carbide crystals utilized by the present invention is provided. Thus, referring first to FIG. 1, a schematic representation of a prior art system 10 for the growth of silicon carbide crystals is shown. This silicon carbide growth system 10 includes a closed-end carbon susceptor or crucible 16. Typically, graphite is selected as the form of carbon used as the material for the crucible 16. A cavity 18 is formed within the crucible 16, so as to be bounded by the walls of the crucible. It is within the cavity 18 that the sublimation and condensation of vapors takes place. A single crystal seed 20 is then attached to the upper region of the crucible cavity 18, while a source 22 of silicon carbide grain is positioned in the lower region of the crucible cavity. However, the positions of source and seed may be reversed, i.e., the source may be placed at the top of the crucible cavity and the seed placed at the bottom of the crucible cavity. Typically, the crucible and crucible cavity have a generally cylindrical shape.

The furnace 12 also includes means for heating the crucible 16. The crucible 16 is heated by any suitable means, such as an induction coil 14. The crucible/susceptor 16 is thermally insulated by thermal insulation 24. The thermal insulation 24 may be any suitable insulating material. However, it is preferred that the thermal insulation 24 be a material which is not significantly affected by the inductive field produced by the induction coil 14. Preferably, a foamed carbon material is used as the material for the thermal insulation 24.

The growth system, i.e., the source 22 for growing crystal 26, and the seed crystal 20 are positioned within the crucible cavity 18. It is preferred that the growth system 20, 22 be provided within a vacuum-tight enclosure 28. Coaxial cylindrical quartz tubes with a cooling water flow between the tubes provides the preferred vacuum-tight enclosure 28.

Physical vapor transport growth occurs in the following general manner: a single-crystal seed 20 of a single polytype, preferably but not limited to 6H or 4H polytype, is attached to the underside of the top surface of the cavity by means of a suitable mechanical device or an adhesive. The lower section of the crucible cavity 18 is filled with the source 22 of silicon carbide grain. This silicon carbide grain should be essentially pure, but may contain certain specific impurities as an aid to transport and growth. The silicon carbide grain need not be a specific polytype, nor need the grain be a specific grain size, nor need the silicon carbide grain be a specific mixture of grain sizes or geometric spacing of different grain sizes.

Prior to growth, the system 10 is typically heated to a temperature and provided a vacuum sufficient to remove adsorbed gases. The system 10 is then filled with pure argon gas to a pressure greater than 100 torr but less than atmospheric. Next, the temperature is increased to approximately the 2100° to 2400° C. region where a partial vapor pressure from the silicon carbide source 22 exists.

The induction coil 14 may be moved axially relative to the crucible 16 to produce a temperature difference between the top and the bottom of the crucible 16. Temperature gradients as low as 10° C./cm and as high as 60° C./cm are suitable for the deposition of silicon carbide on the seed crystal 20.

After thermal equilibrium is achieved, the pressure is slowly reduced to the range of 0.1 to 50 torr. The final pressure is selected that will achieve a significant growth rate and good quality of transport growth. After a period of growth ranging from approximately four hours to more than forty-eight hours, depending on the quantity of source material, the sublimation rate, and the amount of crystal desired, the growth is stopped by increasing the pressure of the argon to atmosphere and reducing the temperature.

Figure 2:
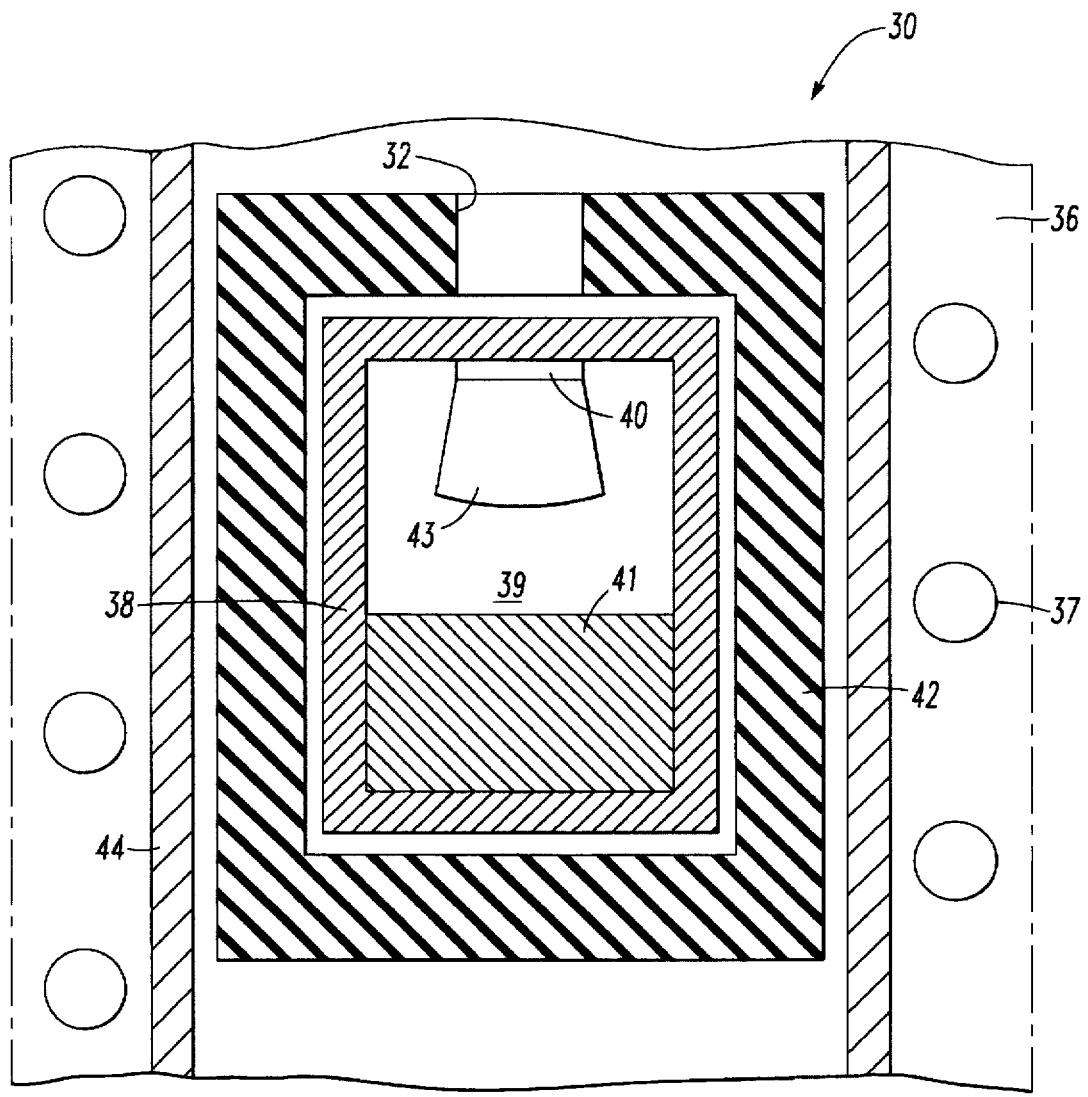
FIG. 2 is a schematic representation of a first preferred system for growing silicon carbide crystals in which the seed crystal is cooled by means of a radiation path to ambient.

Referring next to FIG. 2, a first preferred crystal growth system 30 is shown. The crystal growth system 30 is somewhat similar to the crystal growth system 10 of the prior art in that the silicon carbide growth system 30 includes a carbon crucible 38. Graphite is the preferred form of carbon used as the material for the crucible 38. A cavity 39 is formed within the crucible 38, so as to be bounded by the walls of the crucible. Preferably, the crucible 38 and crucible cavity 39 have a generally cylindrical shape. It is within the cavity 39 that the sublimation and condensation of vapors takes place. A single crystal seed 40 is then attached to the upper region of the crucible cavity 39, while a source 41 of silicon carbide grain is positioned in the lower region of the crucible cavity.

The furnace 36 also includes means for heating the crucible 38, which is preferably an induction coil 37. The crucible 38 is thermally insulated by thermal insulation 42. The thermal insulation 42 may be any suitable insulating material, however, it is preferred that the thermal insulation 42 be a material such as a foamed carbon which is not significantly affected by the inductive field produced by the induction coil 37.

The growth system, i.e., the source 41 and the seed 40 are positioned within the crucible cavity 18. It is preferred that the growth system 40, 41 be provided within a vacuum-tight enclosure 44. Coaxial cylindrical quartz tubes with a cooling water flow between the tubes provides the preferred vacuum-tight enclosure 44. However, a cylindrical aperture 32 is formed in the insulation 42 for the cooling of the seed 40. The aperture 32 in the insulation 42 allows the top of the crucible 38 in the region of the seed 40 to cool relative to other portions of the crucible cavity 39, and hence causes vapor to be condensed on the seed 40. Thus, the aperture 32 acts as a radiation heat leak in the crucible 38. As discussed with regard to the Description of the Prior Art, cooling of the seed in the prior art is achieved through conductive cooling means such as through the use of a cold finger.

Figure 3:
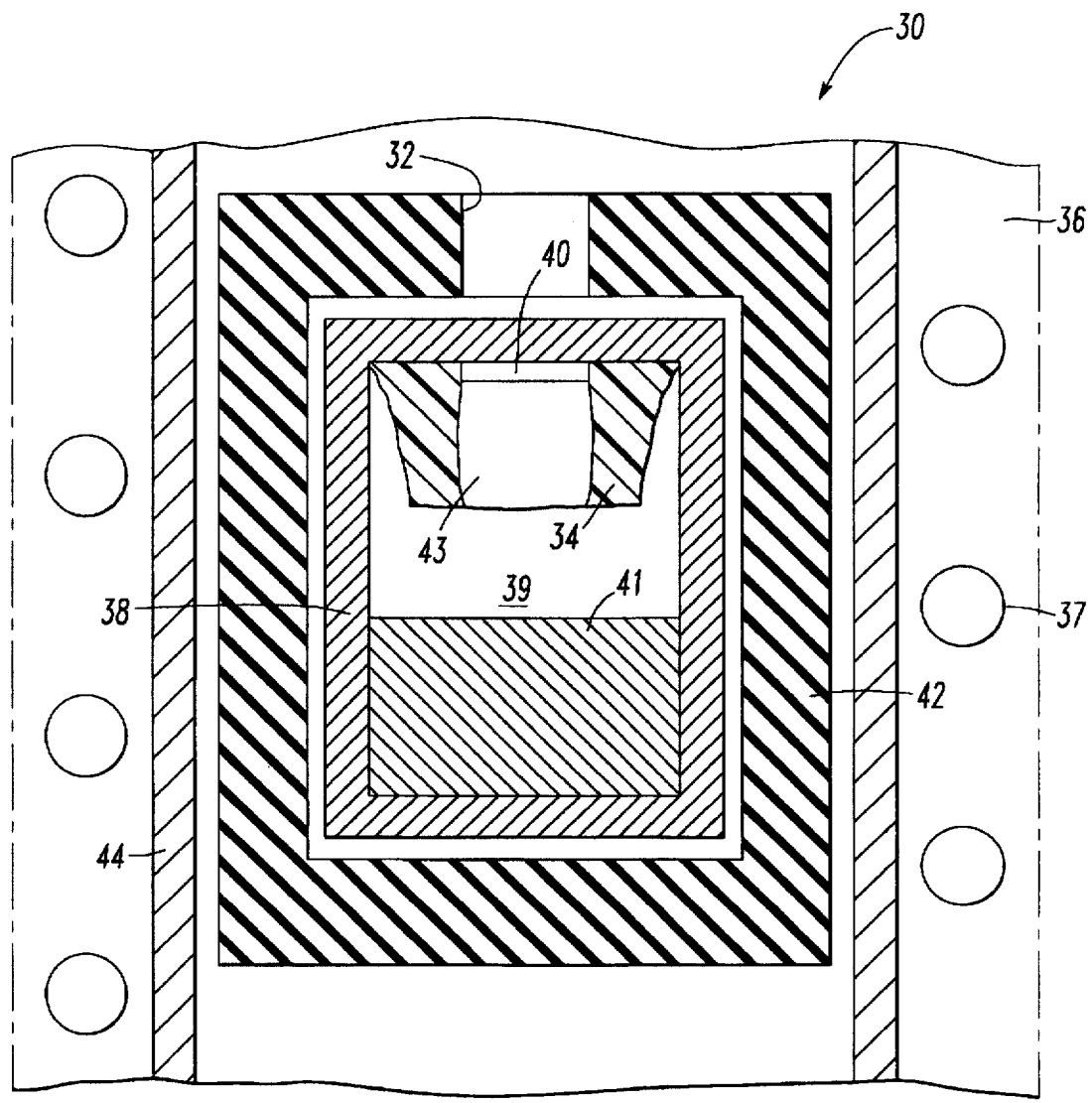
FIG. 3 is a schematic representation similar to FIG. 2 showing the incursion of polycrystalline material into the seed crystal.

Although the first preferred crystal growth system 30 offers the advantage over the prior art systems of utilizing a radiation heat leak rather than a conductive cooling means, in practice, sufficient cooling of the portion of the crucible 38 near the seed 40 in system 30 could result in multiple, uncontrolled nucleations on the graphite crucible 38, as depicted in FIG. 3. Nucleation on the graphite results in the formation of polycrystalline material 34 which grows along with the single crystal 43, resulting in the restriction of the single crystal region and the incursion of defects into the single crystal region. Such defects could include mixed polytype formations, dislocation arrays and micropores. Wafers prepared from this type of growth thus could exhibit crystallographic defects which would limit their usefulness for device fabrication.

Figure 4:
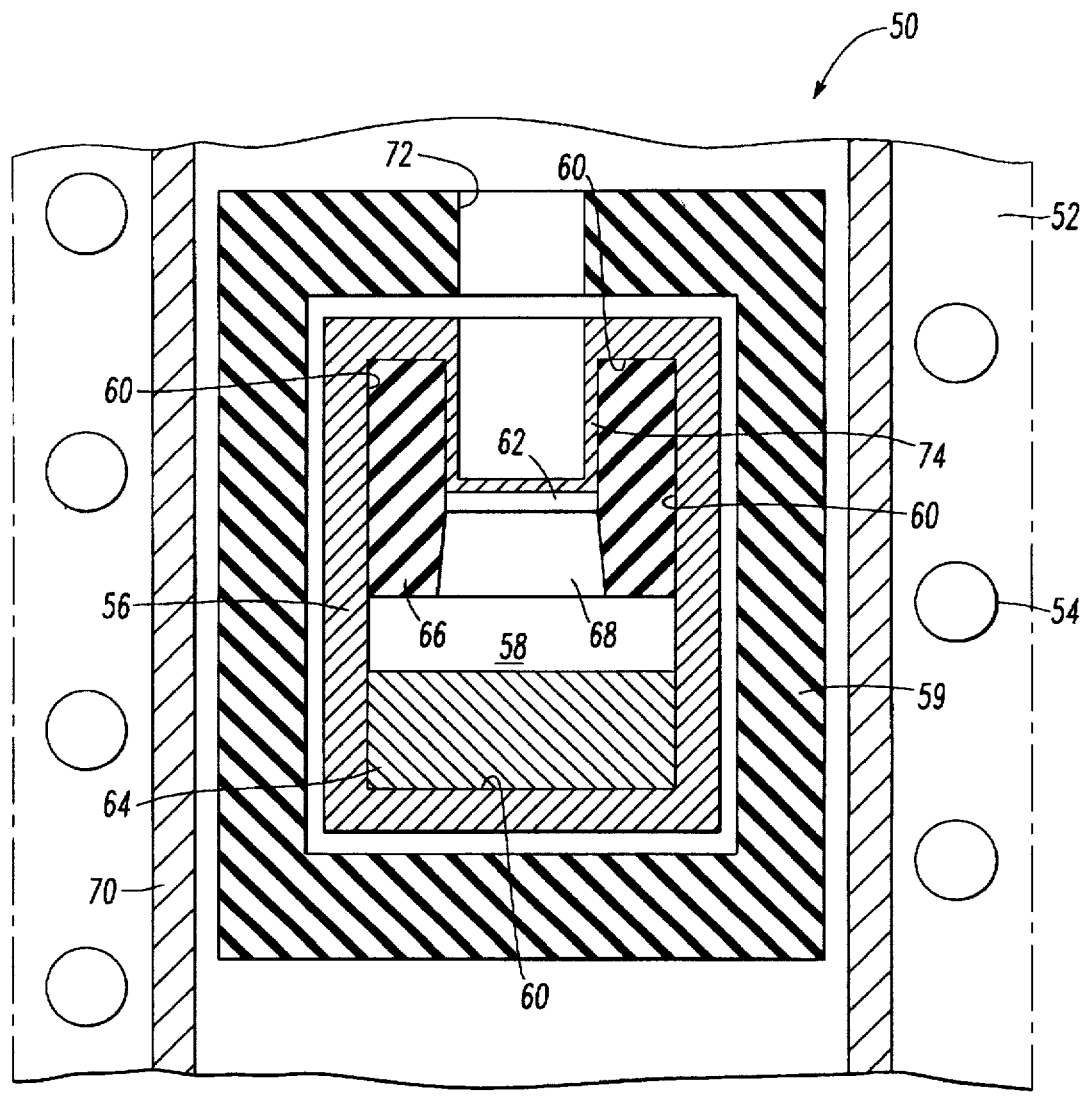
FIG. 4 is a schematic representation of a second preferred system for growing silicon carbide crystals.

Referring next to FIG. 4, a second preferred system 50 is illustrated which also utilizes a radiation heat leak and moreover avoids the problems, discussed above, associated with nucleation. The second preferred silicon carbide crystal growth system 50 utilizes a furnace 52. The furnace 52 includes a carbon crucible 56. As with prior art crucibles, the crucible 56 of the second preferred system 50 preferably utilizes graphite as the carbon material. A cavity 58 is formed within the crucible 56, so as to be bounded by the walls 60 of the crucible 56. As described below, a single crystal seed 62 is attached within the crucible cavity 58 in an upper region of the crucible cavity 58. A source 64 of silicon carbide grain is positioned within the crucible cavity 58 in a lower region of the crucible cavity 58. As with crucibles of the prior art, the crucible 56 and crucible cavity 58 of the second preferred system 50 preferably have a generally cylindrical shape.

Also similar to furnaces of the prior art, the furnace 52 of the second preferred system 50 includes means for heating the crucible 56. The crucible 56 is preferably heated by an induction coil 54, although any suitable heating means may be used. Thermal insulation 59 is also preferably provided around the crucible 56. The thermal insulation 59 is preferably made of carbon foam. The thermal insulation 59 is preferred because it performs the function of thermal insulation without becoming inductively heated by the coil.

A heat leak 72 is provided in the insulation 59 at an area above the crucible 56. The heat leak 72 may either be an aperture or may be some thermally conducting material. If heat leak 72 is made of thermally conducting material, the preferred material is oriented pyrolytic carbon with carbon grains oriented along the heat leak direction to employ the increased thermal conductivity inherent in pyrolytic carbon.

The second preferred system 50 for growing silicon carbide crystals functions in broad terms similarly to the first preferred system 30 shown in FIG. 2. However, as will now be discussed, the mounting of the seed crystal 62 and the cooperation of the seed crystal mounting with the heat leak 72 are different from those described with regard to the first preferred system 30, resulting in even better characteristics of the seed crystals formed by the second preferred system 50.

The seed crystal 62 is mounted to a stepped surface 74 that extends into the cavity region 58 of the crucible 56. As can be seen best in FIG. 5, stepped surface 74 has a mounting portion 76 and a sidewall 78 extending outward from the mounting portion 76. The stepped surface 74 is preferably generally cylindrical, thus the mounting portion 76 is preferably disk-shaped while the sidewall 78 is preferably generally cylindrical. It is preferred that the mounting portion 76 have a surface that is machined or is otherwise finished to have a smooth surface facing the crucible cavity 58.

The sidewall 78 is designed to be thinner in cross section than the mounting portion 76. Thus, mounting portion 76 has a cross sectional thickness depicted as "a" in FIG. 5 that is greater than the cross sectional thickness of the sidewall 78 depicted as "b" in FIG. 5. The preferred wall thickness a of the mounting portion 76 is a range of approximately 5 mm to 15 mm. The preferred wall thickness b of the sidewall 78 is a range of approximately 1 mm to 5 mm.

Although the stepped surface is depicted in the Figures as being a portion of a wall of the crucible, which is preferred, it is distinctly understood that the stepped surface may be a separate member that is attached to one or more walls of the crucible.

In the embodiment shown in FIGS. 4 and 5, the radiation path length from the seed 62 is increased as the seed 62 is positioned into the crucible cavity 58 where the view factor is decreased and primary radiation cooling occurs from the mounting surface 76, discussed in greater detail below.

Heat from the crucible 56 is conducted through a thin section sidewall 78 of the stepped surface 74 to the thicker mounting portion 76 upon which the seed 62 is mounted. Assuming the quantity of heat flow from the crucible 56 to the mounting portion 76 is constant, the temperature of the sidewall 78 will be increased as the cross section of the sidewall 78 is decreased. The increased temperature at the sidewall 78 serves to prevent nucleation from the vapor while promoting deposition upon the seed 62 and the growing crystal 68.

This effect is further improved by an additional thermal insulating member 66, shown in FIG. 4, which may be shaped to conform to the size of the crystal desired. Thus larger crystals may be grown from smaller seeds without the incursion of defective crystals from extraneous nucleations. Thermal insulating member 66 is preferably made of carbon and more particularly graphite which is preferably porous. The carbon/graphite insulating member is preferably prepared as a felt.

This invention is not limited to the preferred embodiments listed above, but rather, variations of the preferred embodiments may be made. For example, the insulating member 66 may be replaced by graphite radiation shields. The graphite radiation shields perform the function of insulating the seed from the hotter crucible 60.

Also, oriented pyrolytic graphite may be used to change the thermal conductivity properties of the thermal insulation. Further, by virtue of a reduction in nucleation sites for SiC vapors, oriented pyrolytic graphite may serve to prevent formation of extraneous crystals.

It is distinctly understood that this invention is not intended to be limited to the reduction of nucleation sites and encroachment of crystallites, but this invention also serves to improve the single crystallinity of grown crystals and reduce the formation of crystalline defects such as pores and dislocations by virtue of a more precise control of the thermal conditions in the vicinity of the growth interface.

While certain present preferred embodiments have been shown and described, it is distinctly understood that the invention is not limited thereto but may be otherwise embodied within the scope of the following claims.

It is claimed:

1. An apparatus for growing single-polytype, single crystals of silicon carbide, wherein the crystal growth occurs by a physical vapor transport, said apparatus comprising:

(a) a furnace having a carbon crucible with walls that border and define a cavity therein;

(b) a silicon carbide source material provided at a first location of the crucible cavity;

(c) a monocrystalline silicon carbide seed provided at a second location of the cavity; and (d) a radiation heat leak heat path provided in the furnace proximate the second location of the crucible cavity.

2. The apparatus of claim 1 further comprising a stepped surface of said crucible extending into said crucible cavity, wherein said stepped surface has a mounting portion upon which said seed is mounted that is bordered at one side by the crucible cavity and is bordered at an opposite side by said furnace heat path, and wherein said stepped surface has a sidewall that is bordered at one side by and surrounds said furnace heat path.

3. The apparatus of claim 2 wherein a side of the stepped surface sidewall opposite to the furnace heat path is bordered by a thermal insulating member.

4. The apparatus of claim 3 wherein the insulating member is made of carbon.

5. The apparatus of claim 4 wherein the carbon insulating member is made of graphite.

6. The apparatus of claim 4 wherein the carbon insulating member is porous.

7. The apparatus of claim 4 wherein the carbon insulating member is a carbon felt.

8. The apparatus of claim 3 wherein the insulating member is made of a plurality of carbon shields.

9. The apparatus of claim 8 wherein the carbon shields are made of graphite.

10. The apparatus of claim 2 wherein the stepped surface sidewall has a thickness that is less than the thickness of the stepped surface mounting portion.

11. The apparatus of claim 10 wherein the stepped surface is composed of pyrolytic graphite oriented so as to increase the temperature of the sidewall relative to the mounting portion as heat flows through said stepped surface.

12. The apparatus of claim 2 wherein the stepped surface mounting portion has a surface facing the crucible cavity that has a smooth finish thereon.

13. The apparatus of claim 1 wherein the furnace heat path is an aperture in the furnace.

* * * * *